(12) United States Patent
Lin-Lefebvre et al.

(10) Patent No.: US 10,520,164 B2
(45) Date of Patent: Dec. 31, 2019

(54) DEVICE FOR CONVERTING THE WAVELENGTH OF ELECTROMAGNETIC RADIATION

(71) Applicant: OSRAM Opto Semiconductors GmbH, Regensburg (DE)

(72) Inventors: I-Hsin Lin-Lefebvre, Regensburg (DE); Reinhard Streitel, Laaber (DE); Michael Schmal, Schmidmühlen (DE); Urs Heine, Regensburg (DE); Eric Lefebvre, Regensburg (DE); Markus Keidler, Pettendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/547,789

(22) PCT Filed: Jan. 29, 2016

(86) PCT No.: PCT/EP2016/051963
§ 371 (c)(1),
(2) Date: Jul. 31, 2017

(87) PCT Pub. No.: WO2016/120460
PCT Pub. Date: Aug. 4, 2016

(65) Prior Publication Data
US 2018/0023782 A1    Jan. 25, 2018

(30) Foreign Application Priority Data
Jan. 29, 2015    (DE) .................. 10 2015 101 330

(51) Int. Cl.
*F21V 9/30* (2018.01)
*B32B 7/12* (2006.01)
*B32B 15/04* (2006.01)
*F21V 7/05* (2006.01)

(52) U.S. Cl.
CPC .................. *F21V 9/30* (2018.02); *B32B 7/12* (2013.01); *B32B 15/04* (2013.01); *F21V 7/05* (2013.01)

(58) Field of Classification Search
None
See application file for complete search history.

(56) References Cited

U.S. PATENT DOCUMENTS 9,515,242 B2   12/2016   Singer
2008/0073643 A1*  3/2008   Ryu ................ H01L 33/02
                                                    257/43
(Continued)

FOREIGN PATENT DOCUMENTS

DE    102010027748 A1   10/2011
DE    102011084949 A1    4/2013
(Continued)

*Primary Examiner* — Matthew Mikels
(74) *Attorney, Agent, or Firm* — Slater Matsil, LLP

(57) ABSTRACT

A device for converting the wavelength of electromagnetic radiation is disclosed. In an embodiment the device includes a carrier, a conversion layer configured to at least partly convert a wavelength of the electromagnetic radiation and an intermediate layer, wherein the conversion layer is connected to the carrier via the intermediate layer, and wherein the intermediate layer, at least in partial regions, includes a solid layer and a connection layer.

20 Claims, 8 Drawing Sheets

(56) References Cited

U.S. PATENT DOCUMENTS

| | | | |
|---|---|---|---|
| 2009/0004419 A1* | 1/2009 | Cok | G03F 1/92 |
| | | | 428/40.1 |
| 2010/0328754 A1* | 12/2010 | Yao | H01L 31/02168 |
| | | | 359/288 |
| 2011/0149549 A1 | 6/2011 | Miyake | |
| 2012/0012864 A1 | 1/2012 | Xie et al. | |
| 2012/0025252 A1* | 2/2012 | Ichizono | C04B 35/117 |
| | | | 257/98 |
| 2013/0107573 A1 | 5/2013 | Kadomi et al. | |
| 2013/0248842 A1* | 9/2013 | Gao | H01L 51/5215 |
| | | | 257/40 |
| 2014/0239196 A1* | 8/2014 | Shoji | G01T 1/202 |
| | | | 250/488.1 |
| 2014/0268644 A1 | 9/2014 | Berben | |

FOREIGN PATENT DOCUMENTS

| | | |
|---|---|---|
| DE | 102012207854 A1 | 11/2013 |
| EP | 1605199 A2 | 12/2005 |
| WO | 2012091975 A1 | 7/2012 |

\* cited by examiner

DEVICE FOR CONVERTING THE WAVELENGTH OF ELECTROMAGNETIC RADIATION

This patent application is a national phase filing under section 371 of PCT/EP2016/051963, filed Jan. 29, 2016, which claims the priority of German patent application 10 2015 101 330.4, filed Jan. 29, 2015, each of which is incorporated herein by reference in its entirety.

TECHNICAL FIELD

The invention relates to a device for converting the wavelength of electromagnetic radiation.

BACKGROUND

In the prior art it is known to use a device for converting the wavelength of electromagnetic radiation comprising a conversion layer, wherein the conversion layer is configured to at least partly convert the wavelength of incident electromagnetic radiation. In particular, such devices are used to convert short-wave emission of an LED at least partly to a longer wavelength in order to generate white light, for example. High evolution of heat may occur in this case, such that good dissipation of heat from the conversion layer is advantageous.

SUMMARY OF THE INVENTION

Embodiments of the invention provide a device in which the thermal conductivity between the conversion layer and a carrier is improved.

One advantage of the device described herein is the fact that the thermal conductivity between the conversion layer and a carrier, which simultaneously serves as a heat sink, is improved. This is achieved by virtue of the fact that an intermediate layer arranged between the conversion layer and the carrier is configured at least partly from a solid layer. By virtue of the configuration of the intermediate layer as a solid layer, it is possible overall to achieve a higher thermal conductivity of the intermediate layer. In addition, the long-term stability of the intermediate layer is improved.

The solid layer may comprise at least one element from the group of metals and/or semimetals and at least oxygen and/or nitrogen. With the aid of these materials, it is possible to achieve a high thermal conductivity with at the same time good long-term stability. In particular, the solid layer may contain metallic or semimetallic materials. In particular, the solid layer may be formed only from a metal.

In addition, the solid layer may be constructed from at least one layer composed of aluminum nitride, and/or indium tin oxide and/or aluminum oxide and/or aluminum oxynitride and/or tantalum oxide and/or tantalum oxynitride and/or titanium dioxide and/or zinc oxide. With the aid of these materials, it is possible to achieve a good thermal conductivity with at the same time good adaptation of the coefficients of thermal expansion to the conversion layer and/or to the carrier. The conversion layer may be configured, for example, from a ceramic material, in particular from a ceramic lamina comprising phosphor. In addition, the carrier may, for example, likewise consist of a ceramic material.

The intermediate layer may comprise one or a plurality of solid layers arranged one on top of another. By virtue of the arrangement of the combination of solid layers, it is possible to achieve an improved adaptation of the coefficients of thermal expansion of the intermediate layer to the conversion layer and to the carrier. In addition, overall an improved long-term stability is achieved.

In a further embodiment, the coefficient of thermal expansion of the first solid layer may be closer to the coefficient of thermal expansion of the conversion layer, wherein the coefficient of thermal expansion of the third solid layer is closer to the coefficient of thermal expansion of the carrier. In addition, the second solid layer may comprise a higher thermal conductivity than the first solid layer and/or the third solid layer. An optimization of the thermal conductivity and the long-term stability may thus be achieved.

The second solid layer may be configured as thicker than the first and third solid layers. Thus, overall an improved heat dissipation is made possible in the case of a higher thermal conductivity of the second solid layer relative to the first solid layer and/or the third solid layer.

In a further embodiment, the first and third solid layers consist of aluminum oxide and the second solid layer consists of aluminum oxynitride and/or of aluminum nitride. As a result, it is possible to achieve an improved adaptation of the coefficients of thermal expansion in particular to a conversion layer which is configured, e.g., in the form of a ceramic and comprises aluminum oxide and phosphor. By way of example, the proportion of phosphor may be between 20 and 30% by volume and the proportion of aluminum oxide may be between 80 and 70% by volume.

Depending on the embodiment chosen, the thermal conductivity of the solid layer may be in the region of >10 W/mK, in particular >50 W/mK, in particular >100 W/mK. A good thermal coupling of the conversion layer to the carrier, which is configured as a heat sink, is achieved in this way.

In a further embodiment, an additional layer and/or layer stack as optical mirror is provided between the conversion layer and the intermediate layer. The reflectivity of the device is improved as a result. This specularly reflective layer structure may be configured, for example, as a DBR mirror or as a metallic optical mirror. By virtue of the provision of the mirror layer, the intermediate layer is protected from the electromagnetic radiation. An accelerated aging on account of the electromagnetic radiation in the intermediate layer is avoided or at least reduced in this way. The provision of a mirror layer is advantageous in particular with the use of an adhesive material as connection layer.

In one embodiment, the conversion layer and the intermediate layer, in particular the solid layer and possibly a further solid layer, are transmissive to electromagnetic radiation, wherein the connection layer and the carrier are arranged outside a transmission region, in particular in the form of a frame.

Consequently, the arrangement may be operated in the transmission direction. In addition, the connection layer and the carrier may be configured for optimum heat conduction.

In one embodiment, the conversion layer, the intermediate layer, in particular the solid layer and possibly a further solid layer, the connection layer and the carrier are transmissive to electromagnetic radiation. Consequently, the arrangement may be operated in the transmission direction.

Depending on the embodiment chosen, a large part of the area of the conversion layer may be covered with the aid of a continuous solid layer. Simple production of the device is made possible as a result.

In a further embodiment, the solid layer may be configured in partial surface regions. Depending on the embodiment chosen, a further connection layer may be arranged in further partial surface regions, which are not covered by the solid layer. A high thermal conductivity with at the same time a high connection force between the conversion layer and the carrier is made possible in this way.

In a further embodiment, the connection layer is produced from a metal layer. An adhesive layer may thus be dispensed with. The long-term stability of the connection layer is improved as a result.

In a further embodiment, the connection layer may be formed from an adhesive layer. As a result, the connection between the conversion layer and the carrier is simpler to produce and more cost-effective.

In a further embodiment, the connection layer may be configured from a combination of a metal layer and an adhesive layer.

In a further embodiment, the solid layer is configured in a plurality of partial regions. The surfaces of the partial regions of the solid layers and further partial regions of the conversion layer or further partial regions of the mirror layer are covered with a metal layer. A high thermal conductivity is made possible in this way.

In a further embodiment, the conversion layer or the mirror layer is covered with a metal layer in the further partial regions, wherein an adhesive layer is arranged on the metal layer, wherein the adhesive layer is in turn connected to the carrier. A high thermal conductivity with at the same time a good adhesive connection is achieved in this way.

In a further embodiment, the adhesive layer comprises a filling material, wherein the filling material constitutes in particular a white-reflecting filling material. In addition, in a further embodiment, the filling material comprises a higher thermal conductivity than the material of the adhesive layer. In this way, the reflection of the device is increased and the thermal conductivity of the adhesive layer is also improved.

In a further embodiment, an intermediate layer is configured between the conversion layer and the carrier, wherein the intermediate layer comprises an adhesive layer at least in partial regions, wherein the adhesive layer comprises a filling material comprising a higher thermal conductivity than the adhesive layer, and wherein the filling material is configured as white-reflecting for electromagnetic radiation.

In one embodiment, the conversion layer may comprise a plurality of ceramic layers, wherein in particular converting layers and non-converting layers are provided. In this case, at least one or a plurality of layers are produced from a ceramic material.

By way of example, the conversion layer may be configured without polymer constituents, e.g., from a ceramic layer and an in particular metallic sintering layer. An improvement of the optical properties of the conversion layer may be achieved in this way.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings, wherein.

DETAILED DESCRIPTION OF ILLUSTRATIVE EMBODIMENTS

Figure 1:
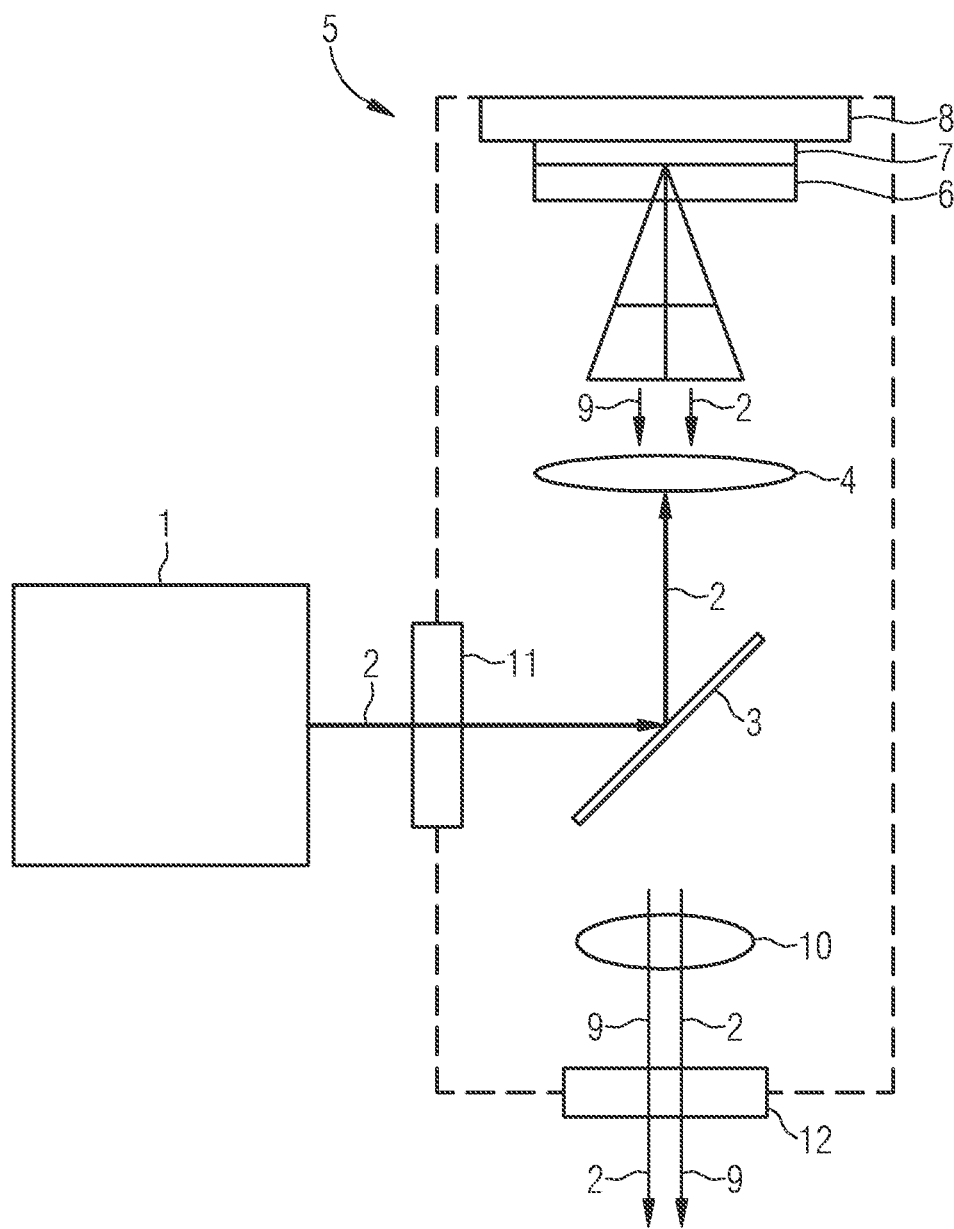
FIG. 1 shows a schematic illustration of an arrangement for generating electromagnetic radiation.

FIG. 1 shows an arrangement for generating electromagnetic radiation in a schematic illustration. In this case, a light source 1 is provided, which emits a first electromagnetic radiation 2. The light source 1 may be, for example, a laser, a laser diode, a light emitting diode or some other type of light source. The light source 1 may be configured in the form of a semiconductor chip. The light source 1 may emit, for example, blue light comprising a wavelength of 445 nm as first electromagnetic radiation 2. Depending on the embodiment chosen, the first electromagnetic radiation may also comprise a different wavelength.

The first electromagnetic radiation 2 is guided via a first window 11 onto a first mirror 3. The first mirror 3 reflects at least part of the first electromagnetic radiation 2 via an optical unit 4 onto a device 5 for converting, i.e., for shifting a wavelength of the electromagnetic radiation 2. The device 5 comprises a conversion layer 6, which is connected to a carrier 8 via an intermediate layer 7. In the conversion layer 6, the wavelength at least of part of the first electromagnetic radiation 2 is converted, i.e., shifted, to a longer wavelength and a second electromagnetic radiation 9 is thus generated. Part of the first electromagnetic radiation 2 and the second electromagnetic radiation 9 generated are reflected by the device 5 and output via the optical unit 4, the first mirror 3 and a further optical unit 10 via a second window 12. The first mirror 3 constitutes a beam splitter that deflects a large part of the first electromagnetic radiation 2 in the direction of the device 5 and transmits the first and second electromagnetic radiation 2, 9 emitted by the device 2 in the direction of the second window 12. Depending on the embodiment chosen, other beam paths or other optical units or other mirrors may also be used to generate a shift in a wavelength of electromagnetic radiation.

The conversion layer 6 may comprise phosphor, for example. In particular, the conversion layer 6 may be configured in the form of a ceramic comprising phosphor. By way of example, the conversion layer 6 may be configured in the form of a ceramic plate comprising 20 to 30% by volume of phosphor with 70 to 80% aluminum oxide ($Al_2O_3$). The thermal conductivity of the conversion layer may comprise, for example, in the range of 20 W/mK or greater. Depending on the embodiment chosen, the conversion layer 6 may also comprise other conversion materials. By way of example, the conversion layer may also consist of a non-ceramic material, for example, may consist of glass or a ceramic material or of some other material.

The conversion layer 6 is connected to the carrier 8 via the intermediate layer 7. The carrier 8 constitutes a heat sink and may be configured, for example, as a ceramic substrate or as a metal plate. In addition, the carrier may be connected to a further heat sink. The thermal conductivity of the carrier 8 may be greater than the thermal conductivity of the conversion layer 6. The task of the intermediate layer 7 consists in establishing a mechanical connection between the conversion layer 6 and the carrier 8 that exhibits long-term stability. In addition, the task of the intermediate layer 7 consists in enabling a good thermal heat conduction between the conversion layer 6 and the carrier 8.

Figure 2:
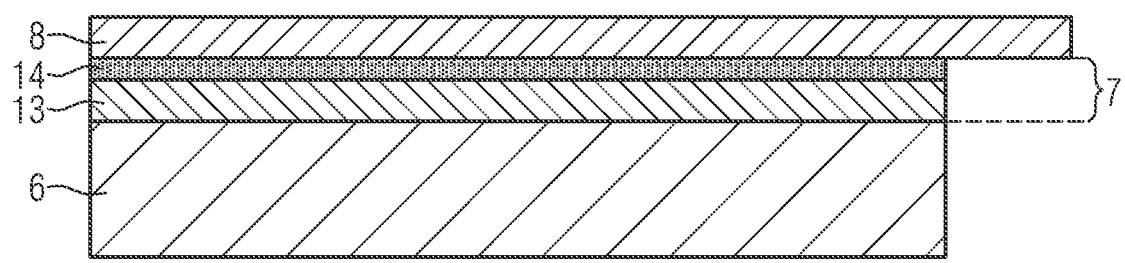
FIG. 2 shows a schematic illustration of a first embodiment of a device for converting a wavelength of electromagnetic radiation.

FIG. 2 shows a first embodiment of the device 5 in a schematic illustration. In this case, the intermediate layer 7 is constructed from a solid layer 13 and a connection layer 14. The conversion layer 6 is covered with the solid layer 13. In addition, the solid layer 13 is connected to the carrier 8 via a connection layer 14. The connection layer 14 may be formed, for example, from a metal and/or from an adhesive material. The solid layer 13 may comprise, for example, at least one element from the group of metals and at least oxygen and/or nitrogen. By way of example, the solid layer may be constructed from at least one layer composed of aluminum nitride and/or indium tin oxide and/or aluminum oxide and/or aluminum oxynitride and/or tantalum oxide and/or titanium oxide and/or zinc oxide. The connection layer 14 may be configured, e.g., in the form of the metal layer, in particular as a solder layer. In addition, the connection layer 14 may be configured from an adhesive layer in particular composed of a polymer or composed of a silicone.

A good thermal coupling of the conversion layer 6 to the carrier 8 prevents an overheating of the conversion layer 6 as a result of the first and the second electromagnetic radiation 2, 9. In addition, with the use of an adhesive layer as connection layer 14, the connection layer 14 is protected from direct irradiation by the solid layer 13. Depending on the embodiment chosen, the thermal conductivity of the solid layer 13 may be 5 watts/(meter*kelvin) (W/mK) for zinc oxide. In addition, the thermal conductivity of the solid layer 13 may be in the region of 20 watts/(meter*kelvin) for aluminum oxide. Furthermore, the thermal conductivity of the solid layer 13 may be in the region of 200 W/mK or greater for aluminum nitride.

The solid layer 13 may be applied on the conversion layer 6, for example, with the aid of thin-film methods. In this case, the solid layer 13 may be deposited onto the conversion layer 6, e.g., with the aid of physical vapor deposition (PVD), in particular electron beam evaporation, electron beam deposition, or a sputtering method, or some other method (chemical vapor deposition CVD).

If the connection layer 14 is configured with the aid of a metal, then this embodiment affords the advantage that a stabler connection, in particular a connection exhibiting greater long-term stability, between the solid layer 13 and the carrier 8 is formed in comparison with an adhesive connection. In particular, the connection layer 14 composed of a metal is less susceptible to heat and electromagnetic radiation. In addition, the metal increases the thermal conductivity. Furthermore, for an improvement of the thermal conductivity, the connection layer 14 in the form of an adhesive connection may comprise filling particles such as, e.g., particles composed of boron nitride BN, aluminum nitride AlN, aluminum oxide $Al_2O_3$ or zinc oxide ZnO or mixed oxides.

Figure 3:
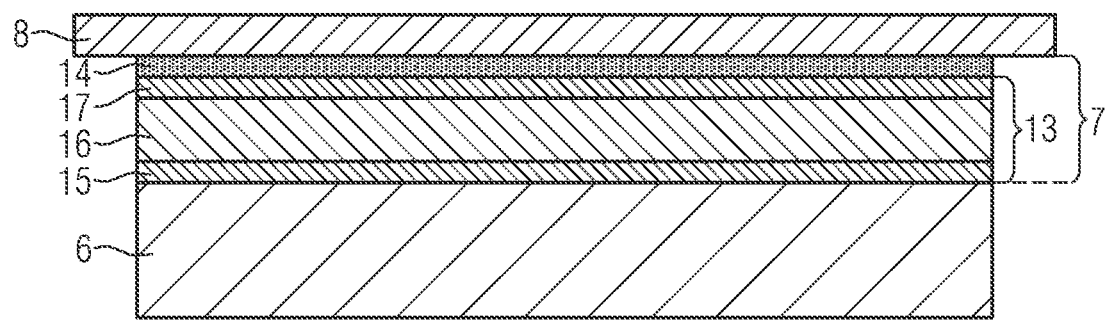
FIG. 3 shows a schematic partial illustration of a further embodiment of a device for converting a wavelength of electromagnetic radiation.

FIG. 3 shows a further embodiment of the device 5, wherein the intermediate layer 7 comprises a solid layer 13 and a connection layer 14. In the exemplary embodiment illustrated, the solid layer 13 is constructed from three layers 15, 16, 17 composed of a solid material. In the embodiment illustrated, the first layer 15 is configured as thinner than the second layer 16. In addition, the third layer 17 is configured as thinner than the second layer 16. Depending on the embodiment chosen, the first and third layers 15, 17 can be configured to be approximately equal in thickness, in particular equal in thickness. In addition, the second layer 16 may comprise a higher thermal conductivity than the first and third layers 15, 17. By way of example, the first and third layers 15, 17 may be constructed from aluminum oxide and the second layer 16 may be constructed from aluminum nitride or aluminum oxynitride.

By virtue of the configuration of the solid layer 13 in the form of a plurality of layers, it is possible to achieve an optimization of the thermal conductivity and the long-term stability for the connection between the carrier 8 and the conversion layer 6. In particular, the layers 15,16,17 of the solid layer 13 may be chosen in such a way that the coefficients of thermal expansion of the layers adjoining one another are adapted to one another. In particular, the first layer 15, which faces the conversion layer 6, may comprise a coefficient of thermal expansion that corresponds approximately to the coefficient of thermal expansion of the conversion layer 6. Furthermore, the third layer 17 may comprise a coefficient of thermal expansion that corresponds approximately to the coefficient of thermal expansion of the connection layer 14. The coefficients of thermal expansion may be regarded as approximately equal in magnitude if the difference is less than 10%, in particular less than 5% or smaller.

Figure 4:
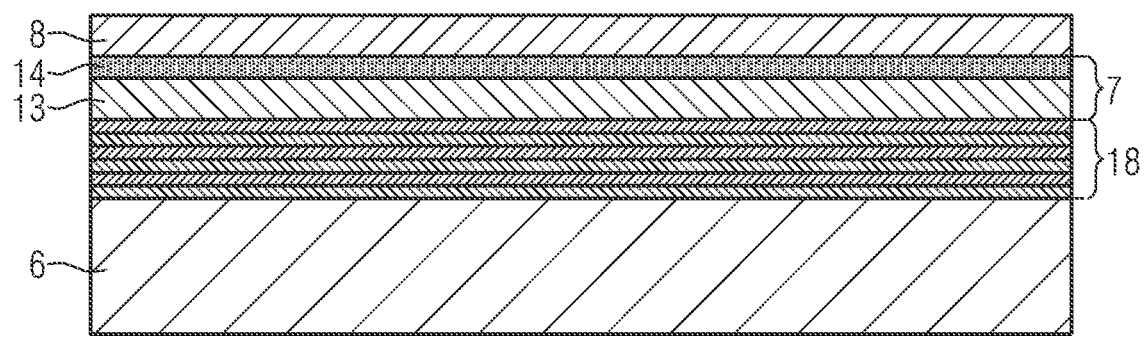
FIG. 4 shows a further embodiment of the device comprising a mirror layer.

FIG. 4 shows a further embodiment of a device 5, wherein a mirror layer 18 is provided between the conversion layer 6 and the solid layer 13. The mirror layer 18 may be configured in the form of a DBR mirror layer, as in the exemplary embodiment illustrated. In this case, a plurality of layers composed of titanium dioxide and silicon dioxide may be provided, e.g., in an alternating fashion. The reflectivity of the device 5 is improved by the provision of the mirror layer 18. In addition, the solid layer 13 and the connection layer 14 are better protected against the first and second electromagnetic radiation 2 and 9. Less evolution of heat in the solid layer 13 and in particular in the connection layer 14 is thus achieved. Instead of the DBR mirror layer, it is also possible to use any other type of mirror layer, in particular a highly reflective mirror layer.

Figure 5:
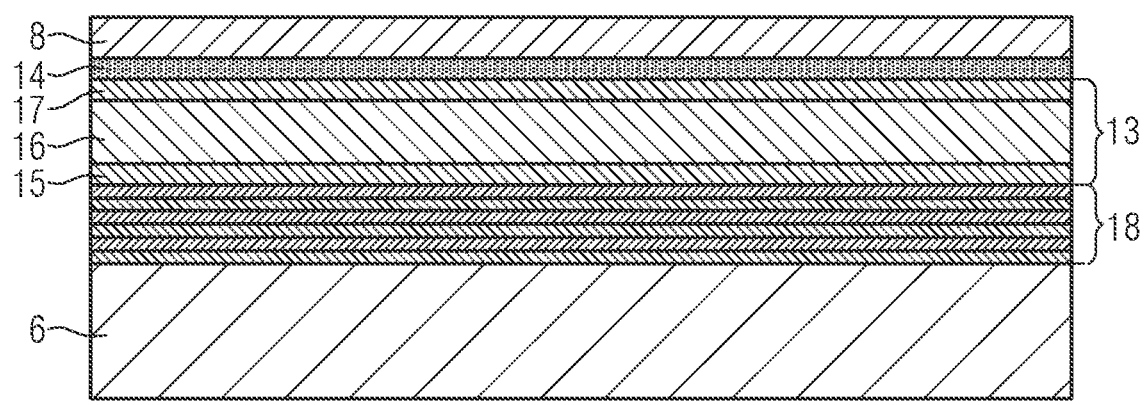
FIG. 5 shows a further embodiment of the device for converting a wavelength of electromagnetic radiation comprising a DBR mirror and an intermediate layer composed of a plurality of solid layers.

FIG. 5 shows a further embodiment of the device 5 comprising a combination of the mirror layer 18 and a solid layer 13, which comprises three layers 15, 16, 17 in the exemplary embodiment illustrated. The three layers 15, 16, 17 correspond to the layers in FIG. 3. Depending on the embodiment chosen, it is also possible to provide more or fewer layers composed of a solid material for forming the solid layer 13. The connection layer 14 may be configured in the form of a metallization layer. The metallization layer may be configured, for example, from gold, silver, platinum or an alloy composed of corresponding metallic materials. On account of the metallization layer, it is possible to dispense with an adhesive layer, for example.

Figure 6:
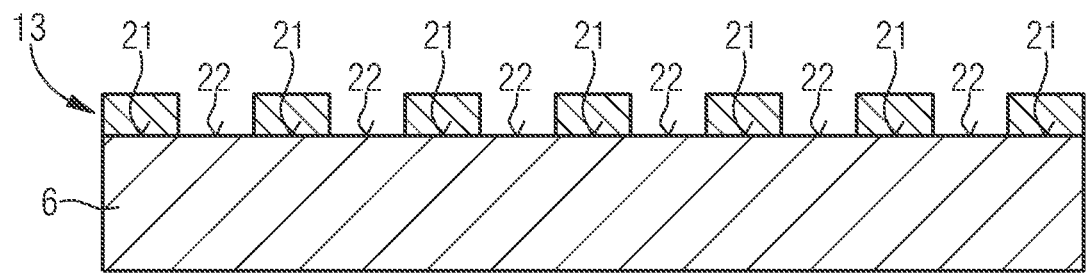
FIG. 6 shows a partial excerpt of a conversion layer with a structured solid layer.
Figure 7:
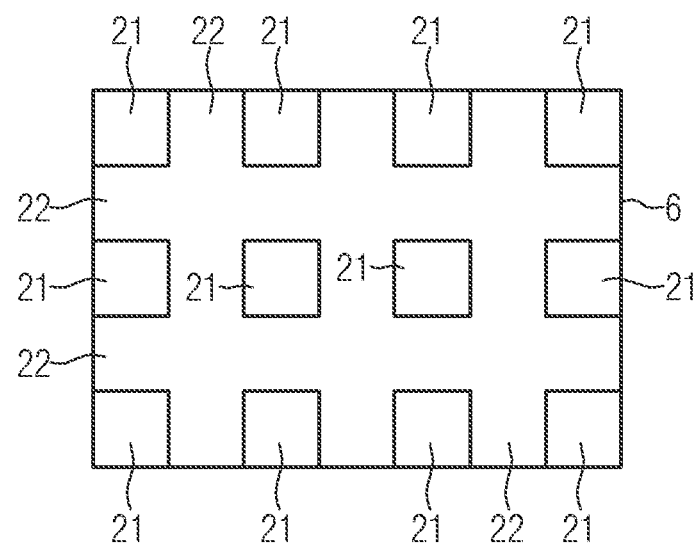
FIG. 7 shows a view from above of the arrangement from FIG. 6.

FIG. 6 shows a conversion layer 6 with a solid layer 13 before the connection layer 14 is applied, and without a carrier, wherein in this embodiment the solid layer 13 is configured in the form of a structured layer. In this case, the solid layer 13 is applied on the conversion layer 6 in first partial areas. FIG. 7 shows a view from above of the arrangement from FIG. 6. In this case, the solid layer 13 is applied on the conversion layer 6 in predefined first partial areas 21. In this case, further partial areas 22 of the conversion layer 6 are free of the solid layer 13. In addition, the structured solid layer 13 in FIGS. 6 and 7 is connected to the carrier 8 via a connection layer 14 in order to complete a device 5. The connection layer 14 may be configured, e.g., from metal and/or from an adhesive layer, in particular a polymer material. With the use of a metal as connection material, the connection between the solid layer 13 and the carrier 8 is established with the aid of a soldering or sintering method. The heat spreading and/or the mechanical linking may be improved as a result.

Figure 8:
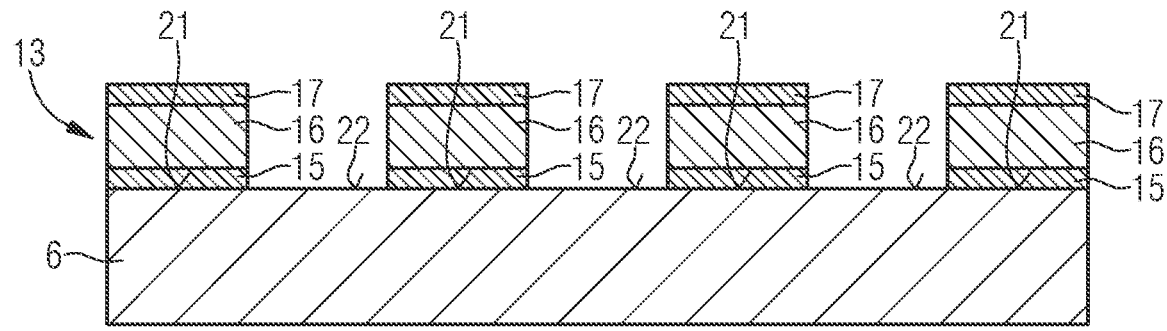
FIG. 8 shows a further embodiment comprising a structured solid layer, wherein the solid layer is constructed from a plurality of layers.

FIG. 8 shows a conversion layer 6 with a solid layer 13 before the application of the connection layer and connection to the carrier, wherein the solid layer 13 is likewise configured as a structured layer and covers only first partial areas 21 of the conversion layer 6. In this embodiment, the solid layer 13 is configured in the form of a plurality of layers. In the exemplary embodiment illustrated, the solid layer 13 is configured from a first, second and third layer 15, 16 and 17. The first, second and third layers 15, 16, 17 may be configured in accordance with the embodiment in FIG. 3. In addition, the structured solid layer 13 is connected to a carrier via a connection layer in order to complete a device 5. In addition, depending on the embodiment chosen, an adhesive layer, for example, composed of a polymer or a metal layer, for example, composed of gold, silver, platinum or a corresponding alloy may be provided as connection layer 14.

Figure 9:
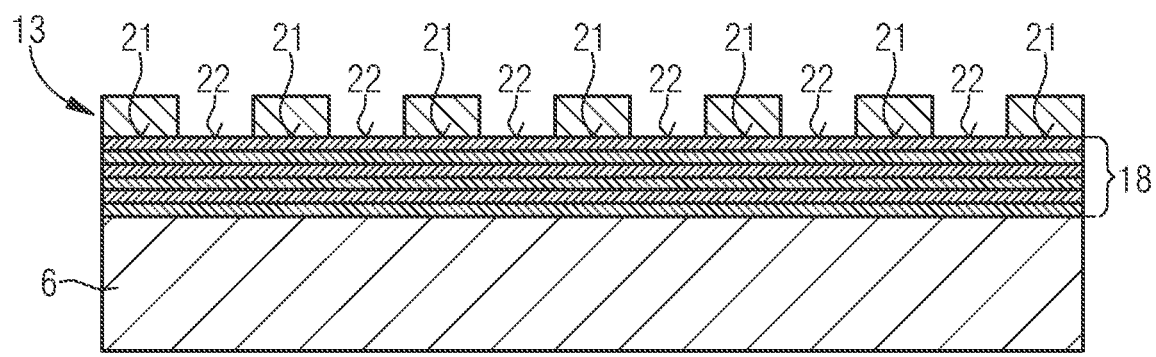
FIG. 9 shows a conversion layer with a mirror layer and a structured solid layer.

FIG. 9 shows a conversion layer 6, on which a mirror layer 18 is applied. In addition, a structured solid layer 13 is applied on partial areas 21 of the mirror layer 18, which is configured, for example, as a DBR mirror layer (Distributed Bragg Reflector) or as a mirror layer. The solid layer 13 may consist of one material or of a plurality of layers arranged one above another, in particular may be constructed from three layers composed of different solid materials. The arrangement is subsequently connected to a carrier by a connection layer.

In a corresponding manner, in the embodiment in FIG. 8, too, a corresponding mirror layer may be provided between the solid layer 13 comprising the three layers 15, 16, 17 and the conversion layer 6.

Figure 10:
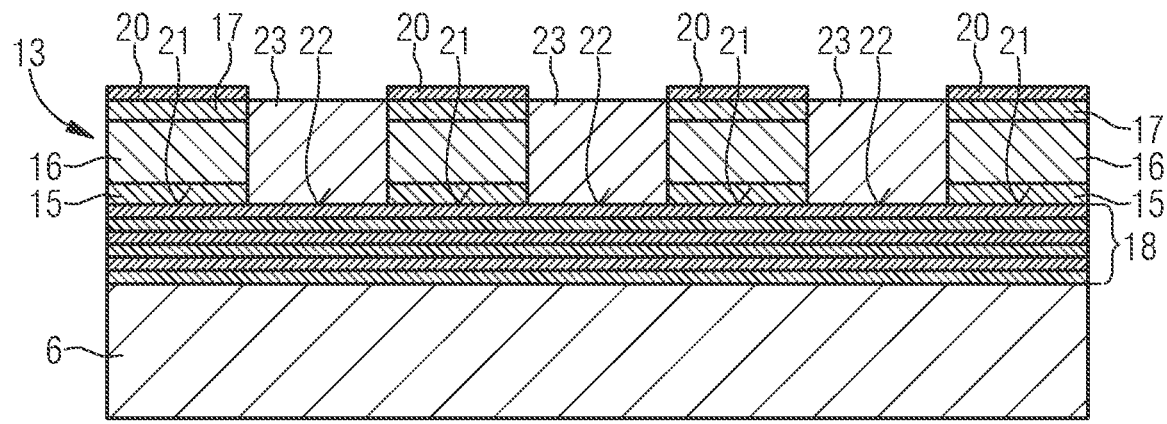
FIG. 10 shows a further embodiment of a device comprising a structured solid layer, which is constructed from a plurality of layers, and a DBR mirror layer.

FIG. 10 shows a further embodiment, in which a mirror layer 18, for example, in the form of a DBR mirror layer is provided on the conversion layer 6. A structured solid layer 13 comprising a plurality of layers 15, 16, 17 in accordance with FIGS. 7, 8 is arranged on first partial areas 21 of the mirror layer 18. In addition, the structured solid layer 13 is provided with a metal layer 20. Depending on the embodiment chosen, the further partial areas 22 of the mirror layer 18, which are free of the structured solid layer 13, may be filled with a filling layer 23, in particular with an adhesive layer or a metal layer. The filling layer 23 may be configured as far as the top side of the metal layer 20. In order to produce the device 5, afterward the metal layer 20 is connected to the carrier either directly or via a further layer. In addition, the connection between the carrier and the conversion layer may also be configured with the aid of the filling layer 23.

Figure 11:
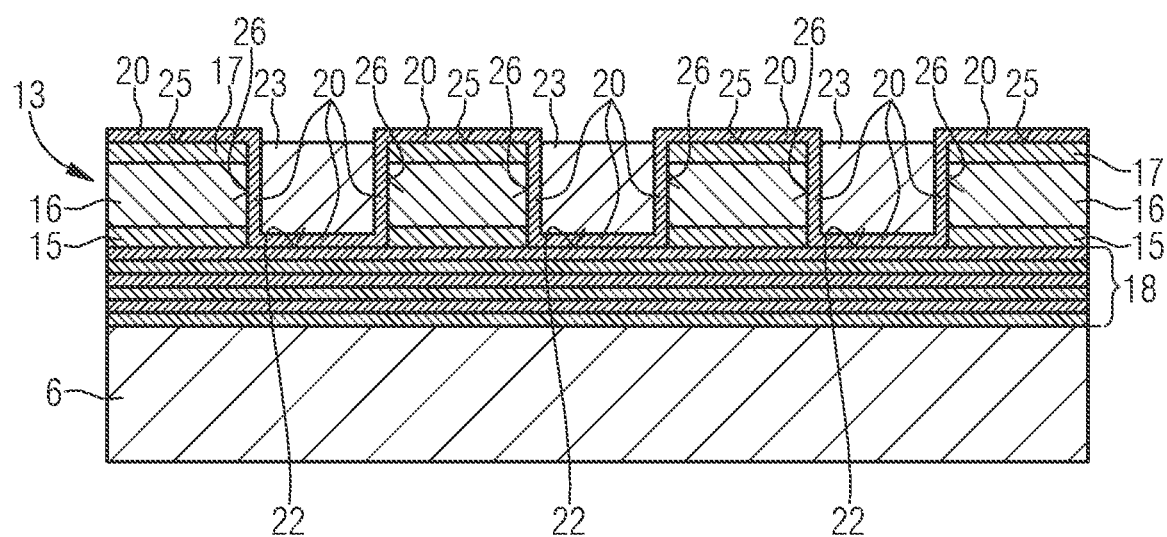
FIG. 11 shows a further embodiment of a device comprising a structured solid layer and a metallization layer.
Figure 13:
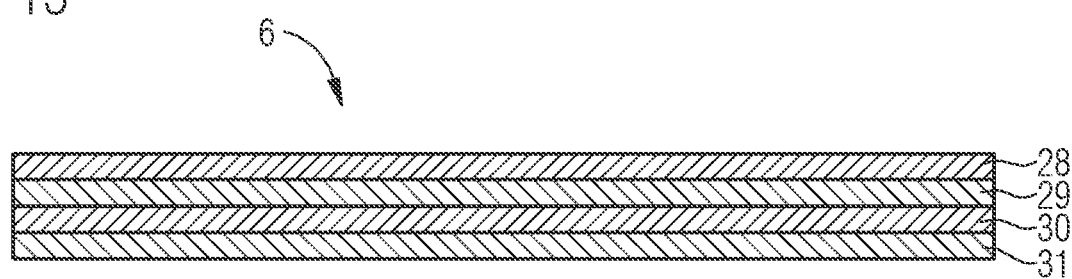
FIG. 13 shows a schematic illustration of a conversion layer constructed from a plurality of layers.

FIG. 11 shows a further embodiment of a conversion layer 5, which substantially corresponds to the embodiment in FIG. 13, but wherein the structured solid layer 13 is covered with a metallization layer 20 on all free areas. In this case, the top side 25 and the four side faces 26 of a segment of the solid layer 13 are covered with the metallization layer 20. In addition, the metallization layer 20 is also configured in the further partial areas 22. Furthermore, a further filling layer 23 is provided in the intermediate regions. The further filling layer 23 may consist of a metal and/or an adhesive layer. In order to produce the device 5, afterward the metal layer 20 is connected to the carrier either directly or via a further layer. In addition, the connection between the carrier and the conversion layer may also be configured with the aid of the filling layer 23.

Figure 12:
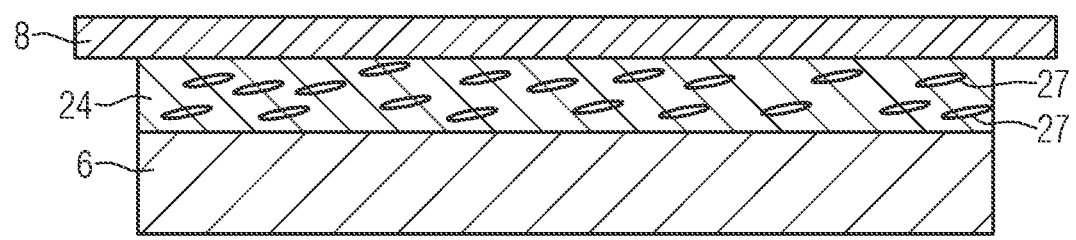
FIG. 12 shows a further embodiment of a device for converting a wavelength of electromagnetic radiation comprising a conversion layer, which is connected to the carrier via a connection layer, wherein the connection layer constitutes an adhesive layer provided with filling material.

FIG. 12 shows a further embodiment of a device 5, wherein a conversion layer 6 is connected to the carrier 8 via an adhesive layer 24 as connection layer. The adhesive layer 24 comprises, for example, a polymer and/or a silicone material. In addition, depending on the embodiment chosen, the adhesive layer 24 may comprise a filling material 27. Particles composed, e.g., of boron nitride, aluminum nitride, aluminum oxide or zinc oxide may be used as filling material. The thermal conductivity of the adhesive layer 24 is increased with the aid of the filling material 27. Furthermore, silicon oxide may also be used as filling material 27. In addition, the filling material 27 may be selected in such a way as to reflect incident electromagnetic radiation in the form of a white spectrum. To that end, white pigments, for example, titanium oxide, may be used.

The filling material 27 may consist of particles comprising, for example, sizes in the nanometers or micrometers range. In addition, a white-reflecting adhesive layer 24 may be obtained by means of a corresponding selection of the filling material 27, for example, by means of use of titanium oxide. Consequently, the wavelength of the electromagnetic radiation which is emitted by the conversion layer 6 is not altered by the provision of the adhesive layer 24.

Depending on the embodiment chosen, each of the embodiments in the figures described may comprise an adhesive layer comprising a filling material 27 in accordance with the example in FIG. 11.

On account of the solid layer 13, in particular in the case of the configuration of the solid layer 13 in the form of a plurality of layers 15, 16, 17 it is possible to compensate for a difference in the coefficient of thermal expansion between the conversion layer 6 and the carrier 8. In addition, depending on the embodiment chosen, it is also possible to configure a corresponding solid layer 13, in particular the configuration of a solid layer 13 in the form of a plurality of layers 15, 16, 17 arranged one on top of another on the carrier 8.

The reflection of the device 5 is improved with the aid of the mirror layer 18. In addition, the loading of the solid layer 13 and/or of the connection layer 14 by electromagnetic radiation is reduced.

In the case of the configuration of the connection layer 14 only with the aid of a metal layer without an adhesive layer, in particular without a silicone-based material or a polymer-based material as adhesive layer, there is no risk of outgassing of the connection material.

The configuration of the structured solid layer 13 provides a larger contact pad for the connection layer 14. An improved connection force between the conversion layer 6 and the carrier 8 is thus made possible. In addition, depending on the embodiment chosen, a solid layer illustrated in accordance with FIGS. 7 to 14, in structured or unstructured form, may be configured on the carrier 8 as well. In addition, the provision of a structured solid layer provides an enlarged area for emitting the heat.

An improved thermal conductivity is made possible with the aid of the arrangement described. In addition, different coefficients of thermal expansion of the conversion layer 6 and of the carrier 8 can be adapted with the aid of the arrangements described. The long-term stability of the device 5 is thus improved. Depending on the embodiment chosen, the device 5 may also be secured directly on an LED chip. The device 5 described may be used to convert the light from an LED or laser diode into a mixed light after reflection at a conversion layer.

Instead of phosphor-containing ceramic plates as conversion layer 6, it is also possible to use spherically configured conversion layers containing, e.g., phosphor or other materials as conversion material. In addition, the device may also be used to convert green light or white light.

FIG. 13 shows an embodiment of the conversion layer 6 which is configured from four layers 28,29,30,31 arranged one above another. Depending on the embodiment, it is also possible to provide only two or three layers or more than four layers. The layers 28,29,30,31 may be configured as converting or non-converting layers, wherein at least one layer is configured as a converting layer. In particular, at least one of the layers may be configured as a sintering layer, in particular as a metallic sintering layer. In addition, the conversion layer 6 may be configured without a polymer material. In addition, the layers 28,29,30,31 may also be configured as ceramic layers. The layers 28,29,30,31 are formed, e.g., from ceramic layers. In particular garnets, for instance yttrium aluminum oxide (YAG), lutetium aluminum oxide (LuAG) and terbium aluminum oxide (TAG) may be used as ceramic conversion substances for the conversion layer 6 or at least one of the layers 28,29,30,31. The materials for the ceramic conversion substance in further embodiments are doped, for example, with one of the following activators: cerium, europium, neodymium, terbium, erbium, praseodymium, samarium, manganese. Cerium-doped yttrium aluminum garnets, cerium-doped lutetium aluminum garnets, europium-doped orthosilicates and europium-doped nitrides shall be mentioned purely by way of example for possible doped ceramic conversion substances.

Figure 14:
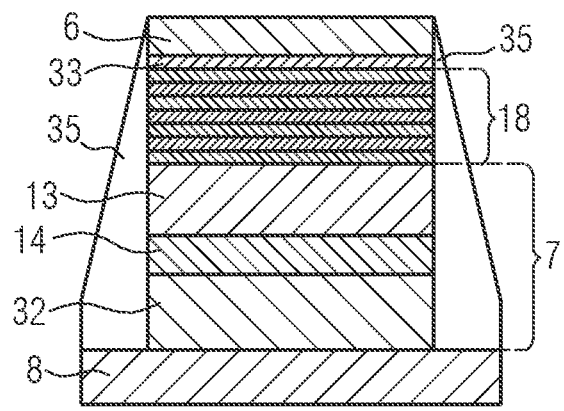
FIG. 14 shows a further embodiment of a device for converting a wavelength of electromagnetic radiation comprising a conversion layer.

FIG. 14 shows a further arrangement comprising a conversion layer 6, a mirror layer 18, comprising a solid layer 13, a connection layer 14 and a second solid layer 32, and comprising a carrier 8. The solid layer 13, the connection layer 14 and the second solid layer 32 form the intermediate layer 7.

The solid layers 13, 32 serve as heat spreading layers. The carrier 8 is configured as a heat sink for dissipating the heat introduced into the converter by electromagnetic radiation incident on the converter from above. A further heat spreading layer 33, which is transmissive to the electromagnetic radiation and is configured, for example, as a solid layer, may be provided between the mirror layer 18 and the conversion layer 6. In addition, the mirror layer may comprise a layer composed of metal on an underside, which faces the solid layer 13, in order to increase the reflectivity.

The arrangement serves to reflect electromagnetic radiation incident from above, after at least partial conversion to a different wavelength in the conversion layer 6, at the mirror layer 18 back upward again via the conversion layer 6. Via the solid layer 13, the connection layer 14 and the second solid layer 32, a mechanical and thermal connection to the carrier 8 is established which firstly establishes securing to the carrier 8 that exhibits long-term stability, and secondly establishes good heat conduction to the carrier 8. The conversion layer 6 may, e.g., be formed from a ceramic material or some other material, in particular glass, and comprise conversion substances, in particular phosphors. The mirror layer 18 is configured, for example, as a DBR mirror or as a highly reflective mirror. The mirror layer 18 may comprise one or a plurality of layers composed of at least one of the following materials: AlO, AlON, AlN, Si, SiO, SiON, SiN, TaO, TiO, TiN, HfO or other suitable materials. The mirror layer 18 may comprise, e.g., a thickness of between 1 and 4 µm. However, thinner or thicker mirror layers may also be used.

The first and second solid layers 13,32 and the heat spreading layer 33 may be configured as a single layer or in the form of a plurality of layers that improve the heat conduction. Materials used may be at least one from the following group: AlO, AlON, AlN, TaO, TiO, ZnO, InSnO, Al, Cu, Ag, Au or other suitable materials. In addition, the solid layer 13 may be configured to absorb the electromagnetic radiation, in particular blue light, in order to protect the connection layer 14. The solid layers 13,32 and the heat spreading layer 33 may comprise, e.g., thicknesses in the range of between 25 nm and 2 µm. The solid layers 13,32 and the heat spreading layer 33 may also comprise other thicknesses.

The connection layer 14 may comprise a metal and/or a polymer. In addition, the connection layer 14 may comprise an adhesive. The thickness of the connection layer 14 which comprises at least one metal or is formed from at least one metal, may be less than 10 µm, in particular less than 5 µm.

The thickness of the connection layer 14 which comprises a solder material or is formed from a solder material may comprise a thickness of 0.5 to 20 µm, in particular a thickness of 1-10 µm. At least one of the following materials may be used as solder material: In, Au—Sn, Sn, Ni—Sn, Cu—Sn—Ag.

The thickness of the connection layer 14 which comprises a sintering material, e.g., an Ag paste, or is formed from a sintering material may comprise a thickness of 0.5 to 20 µm, in particular a thickness of 1-10 µm.

The carrier 8 may comprise a metal and/or a ceramic, such as, e.g., Al, Cu, Cu+W. In addition, the carrier may comprise AlN and/or SiC. The carrier 8 may be constructed from a plurality of layers of the materials mentioned.

In one simple embodiment, the solid layer 13 and the second solid layer 32 may be dispensed with and only a connection layer 14 composed of a solder material and/or composed of a sintering material may be provided.

Depending on the embodiment chosen, one of the solid layers 13,32 may be dispensed with. Depending on the embodiment chosen, the conversion layer 6, the mirror layer 18, the solid layers 13,32, and the connection layer 14 may be surrounded by a thermally conductive frame 35, such that the heat conduction in the direction of the carrier 8 is improved. The frame 35 may consist, e.g., of metal.

Figure 15:
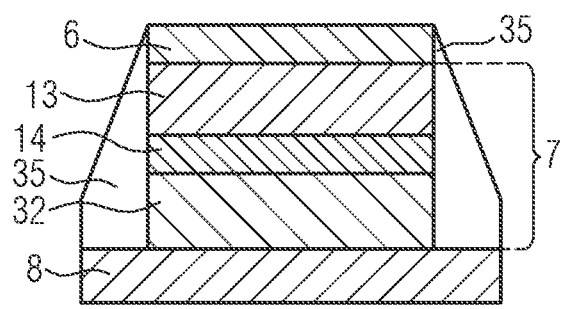
FIG. 15 shows a further embodiment of a device for converting a wavelength of electromagnetic radiation comprising a conversion layer.

FIG. 15 shows an arrangement in which a second solid layer 32 is arranged on a carrier 8. A connection layer 14 is arranged on the second solid layer 32. A first solid layer 13 is arranged on the connection layer 14. A conversion layer 6 is arranged on the first solid layer 13. The solid layer 13, the connection layer 14 and the second solid layer 32 form the intermediate layer 7. No mirror layer is provided in this embodiment. The layers 6,13,14,32 and in particular the carrier 8 are composed of a material which transmits electromagnetic radiation, at least in a predefined wavelength range, without significant absorption. By way of example, the transmission of the arrangement may be greater than 50%, in particular greater than 80%.

The conversion layer 6 may, e.g., be formed from a ceramic material or some other material, in particular glass, and comprise conversion substances, in particular phosphors.

The solid layers 13, 32 should absorb little electromagnetic radiation and nevertheless enable good thermal conduction. As materials for the solid layer 13 and the second solid layer 32, it is possible to use at least one material of the following group: AlO, AlON, AlN, TaO, TiO, ZnO, InSnO. The solid layer 13 and the second solid layer 32 may comprise thicknesses in the range of 25 nm to 2 μm, in particular in the range of between 50 nm and 1 μm.

The connection layer 14 is composed of a transparent material, for example, a polymer material, and may comprise thermally conductive filling material.

The carrier 8 may comprise glass, ceramic such as, e.g., AlO, AlON, AlN, etc., or diamond or consist of one of the materials mentioned.

Depending on the embodiment chosen, one of the solid layers 13,32 may be dispensed with. Depending on the embodiment chosen, the conversion layer 6, the mirror layer 18, the solid layers 13,32, and the connection layer 14 may be surrounded by a thermally conductive frame 35, such that the heat conduction in the direction of the carrier 8 is improved. The frame 35 may consist, e.g., of metal.

Figure 16:
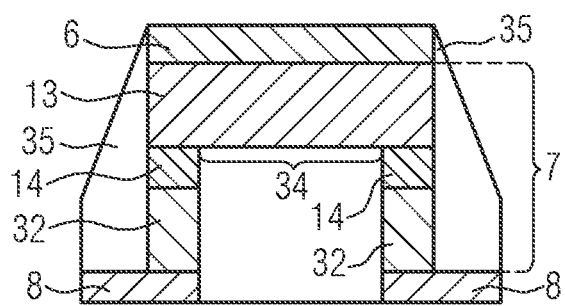
FIG. 16 shows a further embodiment of a device for converting a wavelength of electromagnetic radiation comprising a conversion layer.

FIG. 16 shows an arrangement in which a second solid layer 32 is arranged on a carrier 8. A connection layer 14 is arranged on the second solid layer 32. A first solid layer 13 is arranged on the connection layer 14. A conversion layer 6 is arranged on the first solid layer 13. The solid layer 13, the connection layer 14 and the second solid layer 32 form the intermediate layer 7. No mirror layer is provided in this embodiment. The conversion layer 6 and the solid layer 13 are composed of a material which transmits electromagnetic radiation, at least in a predefined wavelength range, without significant absorption. By way of example, the transmission of the arrangement may be greater than 50%, in particular greater than 80%.

The connection layer 14, the second solid layer 32 and the carrier 8 are arranged outside a transmission region 34. By way of example, the connection layer 14, the second solid layer 32 and the carrier 8 are configured as a quadrilateral frame or as frame parts which are arranged laterally with respect to the transmission region 34.

The conversion layer 6 may, e.g., be formed from a ceramic material or some other material, in particular glass, and comprise conversion substances, in particular phosphors.

The solid layer 13 should absorb as little electromagnetic radiation as possible and nevertheless enable good thermal conduction. As materials for the solid layer 13, it is possible to use at least one material of the following group: AlO, AlON, AlN, TaO, TiO, ZnO, InSnO. The solid layer 13 may comprise a thickness in the range of 25 nm to 2 μm, in particular in the range of between 50 nm and 1 μm.

Since the connection layer 14 is outside the transmission region 34, the connection layer 14 need not be transmissive to the electromagnetic radiation. The connection layer 14 may comprise a metal and/or a polymer. In addition, the connection layer 14 may comprise an adhesive. The thickness of the connection layer 14 which comprises at least one metal or is formed from at least one metal may be less than 10 μm, in particular less than 5 μm.

The thickness of the connection layer 14 which comprises a solder material or is formed from a solder material may have a thickness of 0.5 to 20 μm, in particular a thickness of 1-10 μm. At least one of the following materials may be used as solder material: In, Au—Sn, Sn, Ni—Sn, Cu—Sn—Ag.

The thickness of the connection layer 14 which comprises a sintering material, e.g., an Ag paste, or is formed from a sintering material may comprise a thickness of 0.5 to 20 μm, in particular a thickness of 1-10 μm.

The second solid layer 32 is outside the transmission region 34 and therefore need not be transmissive to the electromagnetic radiation. The second solid layer 32 may be configured as a single layer or in the form of a plurality of layers which improve the heat conduction. Materials used may be at least one from the following group: AlO, AlON, AlN, TaO, TiO, ZnO, InSnO, Al, Cu, Ag, Au or other suitable materials. The solid layer 32 may comprise, e.g., thicknesses in the range of between 25 nm and 2 μm. The second solid layer 32 may also comprise other thicknesses.

The carrier 8 may comprise a metal and/or a ceramic such as, e.g., Al, Cu, Cu+W. In addition, the carrier may comprise AlN and/or SiC. The carrier 8 may be constructed from a plurality of layers of the materials mentioned.

In further embodiments, the conversion layer 6 may comprise a coating in all embodiments in order to improve the connection and/or the heat transfer to the adjoining layers.

Depending on the embodiment chosen, the conversion layer 6, the mirror layer 18, the solid layers 13,32, and the connection layer 14 may be surrounded by a thermally conductive frame 35, such that the heat conduction in the direction of the carrier 8 is improved. The frame 35 may consist, e.g., of metal.

The layers illustrated in FIGS. 2 to 16 and the carrier are illustrated in cross section and may comprise, e.g., a square shape or a rectangular shape perpendicular to the cross section illustrated.

Although the invention has been more specifically illustrated and described in detail by means of the preferred exemplary embodiment, nevertheless the invention is not restricted by the examples disclosed and other variations may be derived therefrom by the person skilled in the art, without departing from the scope of protection of the invention.

The invention claimed is:

1. A device for converting a wavelength of electromagnetic radiation, the device comprising:
   a carrier;
   a conversion layer configured to at least partly convert the wavelength of the electromagnetic radiation; and
   an intermediate layer, wherein the conversion layer is connected to the carrier via the intermediate layer,
   wherein the intermediate layer, at least in partial regions, comprises a solid layer and a connection layer, and wherein the solid layer comprises at least one layer composed of aluminum oxide, AlON, AlN tantalum oxide, tantalum oxynitride, titanium dioxide or zinc oxide.

2. The device according to claim 1, wherein the solid layer comprises a first solid layer, a second solid layer, and a third solid layer, wherein the first solid layer faces the conversion layer, wherein the second solid layer is arranged on the first solid layer, wherein the third solid layer is arranged on the second solid layer, and wherein the third solid layer faces the carrier.

3. The device according to claim 2, wherein the first solid layer has a smaller coefficient of thermal expansion than the second solid layer, and/or wherein the first solid layer and the third solid layer are thinner than the second solid layer.

4. The device according to claim 2, wherein the first solid layer and the third solid layer comprise $Al_2O_3$, and the second solid layer comprises AlON or AlN.

5. The device according to claim 1, further comprising a mirror layer arranged between the conversion layer and the intermediate layer.

6. The device according to claim 1, wherein the solid layer is arranged in a plurality of partial surface regions, and wherein the connection layer is arranged in further partial surface regions.

7. The device according to claim 1, wherein the connection layer comprises a metal layer or an adhesive layer, and wherein the metal layer covers surfaces of solid layers of partial regions and further partial regions.

8. The device according to claim 1, wherein the connection layer comprises a metal layer and an adhesive layer, and wherein the adhesive layer is arranged on the metal layer in further partial regions.

9. The device according to claim 1, wherein the connection layer comprises an adhesive layer, wherein the adhesive layer comprises a filling material, and wherein the filling material is a white-reflecting filling material.

10. The device according to claim 1, wherein the conversion layer comprises two layers that comprises a ceramic material, wherein a first layer of the two layers is a converting layer, and a second layer of the two layers is a non-converting layer, wherein the conversion layer is free of polymer material, and wherein the ceramic material in the first layer comprises a sintering material.

11. A device for converting a wavelength of electromagnetic radiation, the device comprising:
a carrier;
a conversion layer configured to at least partly convert the wavelength of the electromagnetic radiation; and
an intermediate layer, wherein the conversion layer is connected to the carrier via the intermediate layer,
wherein the intermediate layer, at least in partial regions, comprises a solid layer and a connection layer,
wherein the conversion layer and the intermediate layer are transmissive to the electromagnetic radiation,
wherein the connection layer and the carrier form a frame arranged on the solid layer, and
wherein the frame circumvents a transmission region of the conversion layer and of the intermediate layer.

12. The device according to claim 11, wherein the solid layer comprises at least one layer composed of AlN, indium tin oxide, aluminum oxide, AlON, tantalum oxide, tantalum oxynitride, titanium dioxide, or zinc oxide.

13. The device according to claim 11, wherein the solid layer comprises a first solid layer, a second solid layer, and a third solid layer, wherein the first solid layer faces the conversion layer, wherein the second solid layer is arranged on the first solid layer, wherein the third solid layer is arranged on the second solid layer, and wherein the third solid layer faces the carrier.

14. The device according to claim 13, wherein the first and third solid layers comprise $Al_2O_3$, and the second solid layer comprises AlON or AlN.

15. A device for converting a wavelength of electromagnetic radiation, the device comprising:
a carrier;
a conversion layer configured to at least partly convert the wavelength of the electromagnetic radiation; and
an intermediate layer,
wherein the conversion layer is connected to the carrier via the intermediate layer,
wherein the intermediate layer comprises a solid layer in predetermined first partial surface areas of the intermediate layer,
wherein the solid layer connects the conversion layer with the intermediate layer in the first partial surface areas, and
wherein the intermediate layer is free of the solid layer in further partial surface areas.

16. The device of claim 15, wherein the intermediate layer further comprises a connection layer between the solid layer and the carrier, and wherein the connection layer comprises a metal layer.

17. The device according to claim 15, wherein in the solid layer comprises a first solid layer, a second solid layer, and a third solid layer, wherein the first solid layer faces the conversion layer, wherein the second solid layer is arranged on the first solid layer, wherein the third solid layer is arranged on the second solid layer, and wherein the third solid layer faces the carrier.

18. The device according to claim 17, wherein the first and third solid layers comprise $Al_2O_3$, and the second solid layer comprises AlON or AlN.

19. The device according to claim 1, wherein the solid layer comprises at least one layer composed of AlON, tantalum oxide, tantalum oxynitride or titanium dioxide.

20. The device according to claim 1, wherein the solid layer comprises at least one layer consisting essentially of aluminum oxide, AlON, AlN, tantalum oxide, tantalum oxynitride, titanium dioxide or zinc oxide.

* * * * *